(12) United States Patent
Chaware et al.

(10) Patent No.: US 9,761,533 B2
(45) Date of Patent: Sep. 12, 2017

(54) INTERPOSER-LESS STACK DIE INTERCONNECT

(71) Applicant: Xilinx, Inc., San Jose, CA (US)

(72) Inventors: Raghunandan Chaware, Sunnyvale, CA (US); Amitava Majumdar, San Jose, CA (US); Glenn O'Rourke, Gilroy, CA (US); Inderjit Singh, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/885,757

(22) Filed: Oct. 16, 2015

(65) Prior Publication Data

US 2017/0110407 A1   Apr. 20, 2017

(51) Int. Cl.
*H01L 23/538*   (2006.01)
*H01L 25/18*   (2006.01)
*H01L 25/065*   (2006.01)
*H01L 23/00*   (2006.01)

(52) U.S. Cl.
CPC ...... *H01L 23/5385* (2013.01); *H01L 23/5381* (2013.01); *H01L 23/5384* (2013.01); *H01L 23/5386* (2013.01); *H01L 24/17* (2013.01); *H01L 25/0655* (2013.01); *H01L 25/18* (2013.01); *H01L 2224/16227* (2013.01); *H01L 2924/14* (2013.01); *H01L 2924/1431* (2013.01); *H01L 2924/1434* (2013.01); *H01L 2924/1461* (2013.01); *H01L 2924/152* (2013.01); *H01L 2924/153* (2013.01); *H01L 2924/1515* (2013.01)

(58) Field of Classification Search
None
See application file for complete search history.

(56) References Cited

U.S. PATENT DOCUMENTS

| | | | |
|---|---|---|---|
| 7,098,542 B1* | 8/2006 | Hoang | H01L 23/13 257/686 |
| 8,237,274 B1 | 8/2012 | Rahman | |
| 9,418,966 B1 | 8/2016 | Kwon et al. | |
| 2005/0230842 A1* | 10/2005 | Swanson | H01L 23/49575 257/778 |
| 2006/0226527 A1* | 10/2006 | Hatano | H01L 23/5389 257/686 |
| 2010/0327424 A1* | 12/2010 | Braunisch | H01L 23/13 257/692 |
| 2014/0091474 A1 | 4/2014 | Starkston et al. | |

(Continued)

OTHER PUBLICATIONS

U.S. Appl. No. 14/655,908, Woon-Seong Kwon et al., filed Mar. 23, 2015, San Jose, CA USA.

(Continued)

*Primary Examiner* — Bilkis Jahan
(74) *Attorney, Agent, or Firm* — Keith Taboada

(57) ABSTRACT

Techniques for providing a semiconductor assembly having an interconnect die for die-to-die interconnection, an IC package, a method for manufacturing, and a method for routing signals in an IC package are described. In one implementation, a semiconductor assembly is provided that includes a first interconnect die coupled to a first integrated circuit (IC) die and a second IC die by inter-die connections. The first interconnect die includes solid state circuitry that provides a signal transmission path between the IC dice.

20 Claims, 12 Drawing Sheets

(56) References Cited

U.S. PATENT DOCUMENTS

2014/0177626 A1    6/2014  Thottethodi et al.

OTHER PUBLICATIONS

Altera Corporation, Manish Deo, Enabling Next-Generation Platforms Using Altera's 3D System-in-Package Technology, WP-01251-1.0, Jun. 2015, 11 pages, San Jose, CA USA.
U.S. Appl. No. 14/665,908, Woon-Seong Kwon et al., filed Mar. 23, 2015, San Jose, CA USA.

* cited by examiner

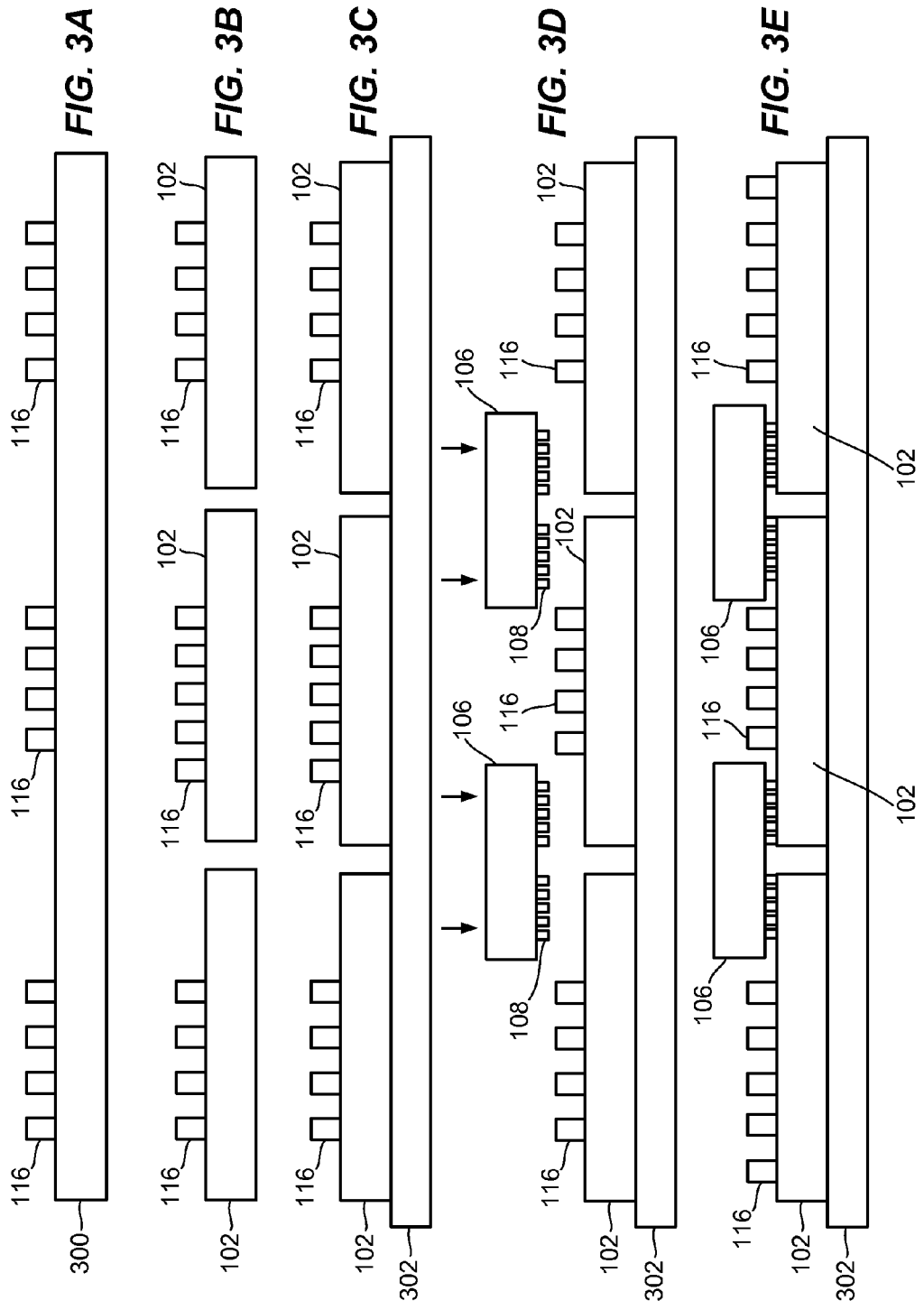

| Configuration | | | Control Signals | | | | | | | |
|---|---|---|---|---|---|---|---|---|---|---|
| Dir. | Path | Byp | Byp_Sel | In_Mux | BFF2RT | BFF2RB | BFF2LT | BFF2LB | TFF2RT | TFF2RB | TFF2LT | TFF2LB |
| 0 | 0 | 1 | 1 | L | 0 | 1 | 0 | 0 | 1 | 0 | 0 | 0 |
| 0 | 0 | 0 | 0 | L | 0 | 1 | 0 | 0 | 1 | 0 | 0 | 0 |
| 0 | 1 | 1 | 1 | L | 1 | 0 | 0 | 0 | 0 | 1 | 0 | 0 |
| 0 | 1 | 0 | 0 | L | 1 | 0 | 0 | 0 | 0 | 1 | 0 | 0 |
| 1 | 0 | 1 | 1 | R | 0 | 0 | 0 | 1 | 0 | 0 | 1 | 0 |
| 1 | 0 | 0 | 0 | R | 0 | 0 | 0 | 1 | 0 | 0 | 1 | 0 |
| 1 | 1 | 1 | 1 | R | 0 | 0 | 1 | 0 | 0 | 0 | 0 | 1 |
| 1 | 1 | 0 | 0 | R | 0 | 0 | 1 | 0 | 0 | 0 | 0 | 1 |

➢ Direction: Right = 0; Left = 1;
➢ Path: Straight = 0; Cross = 1;
➢ FF Bypass: Yes = 0; No = 1;

➢ Byp_Sel = Byp
➢ In_Mux = Dir
➢ BFF2RB = TFF2RT = ~(Dir | Path)
➢ BFF2RT = TFF2RB = ~Dir & Path
➢ BFF2LB = TFF2LT = Dir & ~Path
➢ BFF2LT = TFF2LB = Dir & Path

FIG. 11

INTERPOSER-LESS STACK DIE INTERCONNECT

TECHNICAL FIELD

Examples of the present disclosure generally relate to semiconductor devices and, in particular, to a semiconductor assembly having an interconnect die for die-to-die interconnection in a chip package.

BACKGROUND

Integrated circuits (IC) architectures have evolved to incorporate a number of heterogeneous functions in a single package, where each function is performed by a separate IC the or chip-scale package (CSP). Such an architecture is sometimes referred to as a system-in-package (SiP). One type of SiP architecture involves mounting multiple IC dice to an interposer, which is, in turn, mounted to a package substrate. The interposer includes through-die vias (TDVs), also referred to as through-silicon vias (TSVs), which connect metallization layers on both its upper and lower surfaces. The metallization layers are used to convey electrical signals among the multiple IC die, and between each of multiple IC the to the package substrate. This type of SiP architecture is sometimes referred to as a 2.5 dimensional (2.5D) package. However, use of a 2.5D architecture for a SiP package significantly increases costs, as a separate interposer must be designed, manufactured, and tested.

SUMMARY

Techniques for providing a semiconductor assembly having an interconnect die for die-to-die interconnection, an IC package, a method for manufacturing, and a method for routing signals in an IC package are described. In one implementation, an interconnect die is provided that includes a body having a first surface and a second surface defined on opposite sides of the body. A first plurality of conductive pads and a second plurality of conductive pads are formed on the first surface of the body. The second plurality of conductive pads are grouped and physically spaced from the first plurality of conductive pads in an orientation configured to allow separate integrated circuit (IC) dice to physically and electrically connect with the interconnect die via electrical inter-die connections for passing signals between the IC dice and the interconnect die. The body includes an interconnect circuit comprising solid state circuitry that is operable to select one of the first plurality of conductive pads for connection with a selected one of the second plurality of conductive pads.

In another implementation, a semiconductor assembly is provided that includes a first interconnect die coupled to a first integrated circuit (IC) die and a second IC die by inter-die connections. The first interconnect die includes solid state circuitry that provides a signal transmission path between the IC dice.

In another implementation, an integrated circuit (IC) package is provided. The IC package includes a package substrate, a first interconnect die and a first integrated circuit (IC) die and a second IC die. The first interconnect die is coupled to the IC dice by inter-die connections. The package substrate is coupled to the IC dice and the first interconnect die by a plurality of electrical interconnects.

In another implementation, a method of manufacturing a semiconductor assembly is provided. The method includes securing at least two integrated circuit (IC) dice to a carrier substrate, the IC dice having a plurality of conductive pillars extending therefrom; connecting an interconnect die to the IC dice, the connection between the interconnect die and the IC dice suitable for transmitting signals therebetween; covering the interconnect die and the IC dice with an overmold; removing a portion of the interconnect die and the overmold to expose the conductive pillars; forming electrical interconnects on the conductive pillars and interconnect die; removing the carrier substrate; and connecting the interconnect die and the IC dice to a package substrate utilizing the electrical interconnects.

In yet another implementation, a method for routing signals in an IC package is provided. The method includes transmitting signals from a first integrated circuit (IC) die to a second IC die through a first interconnect die directly coupled to the IC dice by inter-die connections; and transmitting signals between the first interconnect die directly coupled to a package substrate by the IC dice by electrical interconnects.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIGS. 3A-3J are simplified schematic cross-sectional views illustrating one example of a process for manufacturing a semiconductor assembly, and ultimately, an IC package.

FIG. 11 is a logic table for the functional implementation of the programmable element illustrated in FIG. 10.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
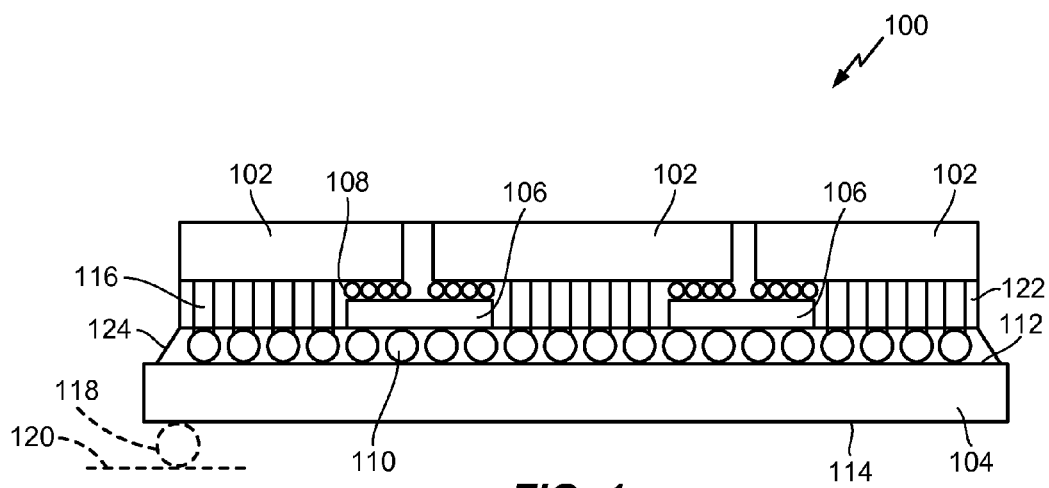
FIG. 1 is a schematic cross-sectional view of an example of an integrated circuit (IC) package having an interconnect die coupling at least two dice.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described.

Techniques for providing a semiconductor assembly having an interconnect die for die-to-die interconnection, an integrated circuit (IC) package, a method for manufacturing, and a method for routing signals in an IC package are described. In an example, a semiconductor assembly includes an interconnect die configured to electrically connect at least two IC dice. The interconnect die includes circuitry configured for mechanical and electrical coupling to inter-die contacts on the IC dice. In some implementations, the circuitry of the interconnect die may include solid state circuit elements, such as programmable elements. In some implementations, the circuitry of the interconnect die may be configured for mechanical and electrical coupling to a package substrate. One or more advantages that may be realized through the implementations described herein as compared to conventional designs that utilize an interposer include a reduction in the area conventionally required to couple dice, enhanced programming flexibility, ability to pipeline signals through the interconnect die, reduced wire length and capacitance, power reduction, improved supply logistics (as many current FABS may be utilized to fabricate the interconnect die), and improved defect and fault tolerance.

FIG. 1 is a schematic cross-sectional diagram showing an example of an integrated circuit (IC) package 100 having one or more interconnect dice 106 connecting least two IC dice 102 that are mounted to a package substrate 104. Three IC dice 102 connected by two interconnect dice 106 are shown in FIG. 1 by way of example, as it is contemplated that any number of IC dice may be utilized as constrained by the available area, and one or more of the IC dice may be connected utilizing one or more interconnect die.

The IC dice 102 are mounted to the interconnect die 106, and optionally to the package substrate 104. The IC dice 102 may be programmable logic devices, such as field programmable gate arrays (FPGA), memory devices, optical devices, processors or other IC logic structures. Optical devices include photo-detectors, lasers, optical sources, and the like.

The IC dice 102 are mounted to the interconnect die 106 by a plurality of electrical inter-die connections 108, such as solder, micro-bumps or other connection suitable for signal transmission. The IC dice 102 are also mounted to a top surface 112 of the package substrate 104 by a plurality of electrical interconnections 110, such as solder, controlled collapse chip connection (C4) bumps or other connection suitable for signal transmission. To compensate for the added spacing between the IC dice 102 and the package substrate 104 due to the presence of the interconnect die 106 therebetween, conductive pillars 116 may extend from the IC dice 102 to a distance substantially equal to that of the interconnect die 106 so that the same size electrical interconnections 110 may be utilized to couple both the IC dice 102 and the interconnect dice 106 to the package substrate 104.

Solder balls 118 or other wiring technique may be utilized to couple a bottom surface 114 of the package substrate 104 to a printed circuit board (PCB) board 120 after the IC package 100 is mounted within an electronic device (not shown). Both the solder balls 118 and PCB board 120 are shown in phantom in FIG. 1.

In this manner, signals may be routed through the IC package 100 to enable communication between components of the IC package 100 (i.e., the dice 102, 106 and package substrate 104) in at least one or more of the techniques that follow. For example, signals may be exchanged between the IC dice 102 directly through one of the interconnect dice 106. Signals may be exchanged between the IC dice 102 directly through the package substrate 104. Signals may be exchanged between the IC dice 102 through both the interconnect dice 106 and the package substrate 104. Signals may be exchanged between one of the IC dice 102 and the package substrate 104 (and ultimately the PCB board 120) through one of the interconnect dice 106, and/or to the package substrate 104 directly. Thus, the use of the interconnect die 106 eliminates the need for an interposer as utilized in conventional 2.5D and 3D IC packages.

The IC package 100 may also include an undermold 124 filling the space between the electrical interconnections 110. The undermold 124 mechanically secures the dice 102, 106 to the package substrate 104. The IC package 100 may also include an overmold 122 filling the space between the electrical inter-die connection 108, conductive pillars 116 and dice 102. The undermold 124 and overmold 122 can comprise any type of material suitable for such purpose, such as an epoxy molding compound. The overmold 122 mechanically secures the dice 102 to the interconnect dice 106.

Figure 2:
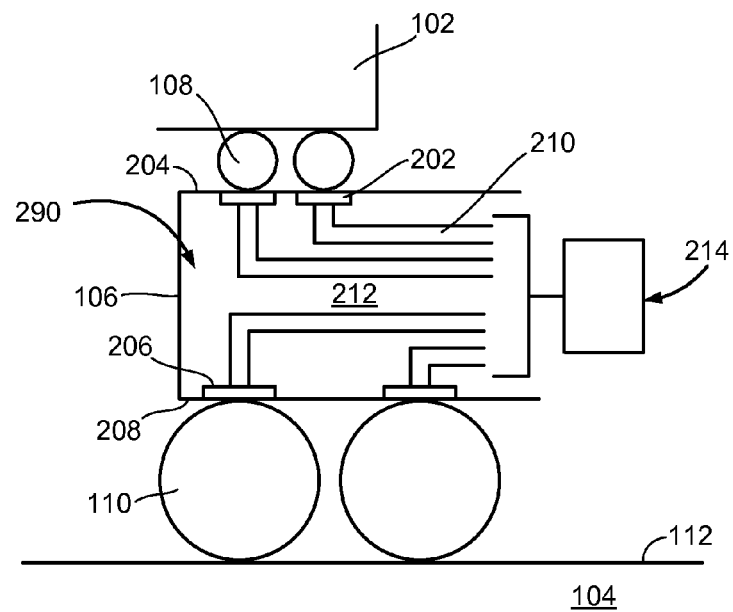
FIG. 2 is an enlarged schematic partial cross-sectional view of a portion of the interconnect die coupling the dice depicted in FIG. 1.

FIG. 2 is an enlarged schematic partial cross-sectional view of a portion of the interconnect die 106 coupled to one of the dice 102 depicted in FIG. 1. The interconnect die 106 has a body 290 that includes a plurality of conductive pads 202 disposed on a first surface 204 of the die 106, and a plurality of conductive pads 206 disposed on a second surface 208 of the die 106. The conductive pads 202 are utilized to physically and electrically connect with the electrical inter-die connection 108 for passing signals between the die 102 and the interconnect die 106. The conductive pads 206 are utilized to physically and electrically connect with the electrical interconnections 110 for passing signals between the interconnect die 106 and the package substrate 104.

The body 290 of the interconnect die 106 includes a plurality of conductive layers 210 and dielectric layers 212 which are fabricated to form an interconnect circuit 214 within the die 106. The conductive layers 210 and dielectric layers 212 of the interconnect die 106 may be formed on a substrate, such as a ceramic substrate, an organic substrate, or a semiconductor substrate. As an example, the interconnect circuit 214 may be formed on a silicon substrate utilizing traditional or other suitable semiconductor device or interconnect processing technique. The connection between the interconnect circuit 214 and pads 206 may be formed using vias, as known in the art, or by other suitable technique.

The interconnect circuit 214 generally has a significantly reduced wire length and total capacitance, as compared to IC packages utilizing interposers to interconnect dice, thus reducing the RC load and power consumption while enhancing performance. Depending on the implementation, the interconnect circuit 214 may connect two separate pads 202, two separate pads 206, one of the pads 202 to one of the pads 206, or other combination as desired. In one implementation, the interconnect circuit 214 may be a passive circuit, only having wiring connecting the various pads 202, 206. In another implementation, the interconnect circuit 214 may include one or more passive circuit elements, such as resistors, capacitors, inductors, electrostatic discharge wells, transformers and the like. In another implementation, the interconnect circuit 214 may include one or more active circuit elements. In another implementation, the interconnect circuit 214 may include solid state circuitry, such as one or more of a memory and/or logic device. In yet another implementation, the interconnect circuit 214 may include one or more MEMS devices or optical signal transmission elements. It is contemplated that the interconnect circuit 214 may include one or more elements from one or more of the various implementations described above. The plurality of conductive pads 202 disposed on the first surface 204 of the interconnect die 106 may be arranged in separate and physically spaced groups to allow discrete integrated circuit (IC) dice to physically and electrically connect with the interconnect die 106 via electrical inter-die connections for passing signals between the IC dice and the interconnect die. For example, a first plurality of conductive pads 202 and a second plurality of conductive pads 202 may be formed on the first surface 204 of the body 290. The second plurality of conductive pads are grouped and physically spaced from the first plurality of conductive pads in an orientation configured to allow separate integrated circuit (IC) dice 102 to physically and electrically connect with the interconnect die 106 via electrical inter-die connections for passing signals between the IC dice 102 and the interconnect die 106.

Optionally, a third plurality of conductive pads 202 may be formed on the first surface 204 of the interconnect die 106. The third plurality of conductive pads 202 are grouped and physically spaced from the first and second plurality of conductive pads 202 in an orientation configured to allow one or more separate integrated circuit (IC) dice 102 to physically and electrically connect with the interconnect die 106 via electrical inter-die connections for passing signals between the IC dice 102 and the interconnect die 106. The interconnect circuit 214 is operable to select one of the first or second plurality of conductive pads 202 for connection with a selected one of the third plurality of conductive pads 202.

FIGS. 3A-3J are simplified schematic cross-sectional views illustrating one example of a process for manufacturing a semiconductor assembly, and ultimately, an IC package, such as the IC package 100 depicted in FIG. 1, which include an interconnect die 106. It is contemplated that other processes may be utilized to semiconductor assemblies, and ultimately, an IC package having an interconnect die 106.

Referring first to FIG. 3A, a semiconductor wafer 300 is processed to form a plurality of dice 102 (as later shown in FIG. 3B) utilizing suitable fabrication techniques. The pads 202 are not shown in FIG. 3A, but are present as illustrated in FIG. 2. The conductive pillars 116 are formed on a top surface of the wafer 300, for example, by a suitable deposition technique such as electroplating, physical vapor deposition, screen printing, or inkjet printing, among others. The distal ends of the conductive pillars 116 may be planarized or otherwise processed to provide a uniform planar surface. The conductive pillars 116 may extend about 60 to 80 μm from the wafer 300 (and ultimately may extend about 60 to 80 μm from the dice 102).

Referring now to FIG. 3B, the wafer 300 is diced to separate the dice 102. After separation, the individual dice 102 are mounted to a carrier wafer 302, as shown in FIG. 3C, and the interconnect die 106 are mounted to the dice 102 utilizing the electrical inter-die connection 108, as illustrated in FIGS. 3D and 3E. It is contemplated that the individual dice 102 mounted to the carrier wafer 302 may originate from different wafers 300.

Figure 3F:
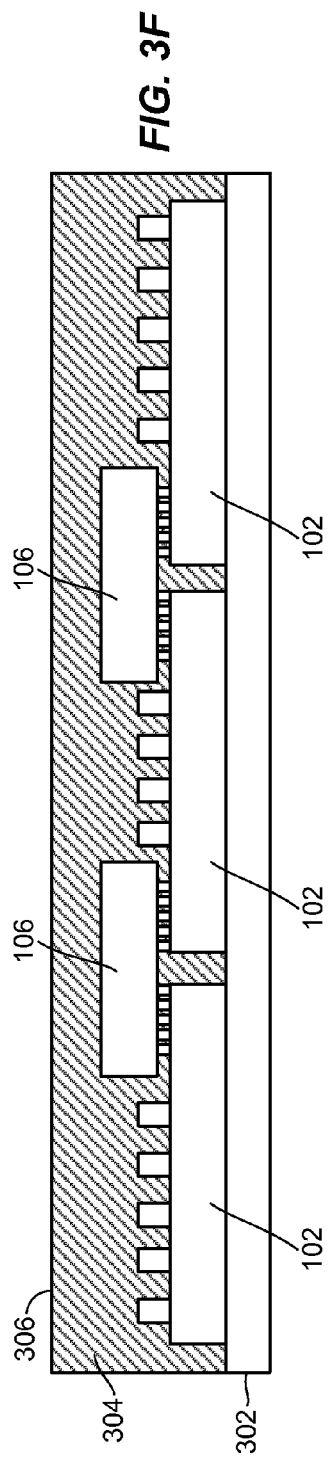

The overmold 304 is then applied over the dice 102, 106, as illustrated in FIG. 3F. The overmold 304 can comprise any type of material suitable for such purpose, such as an epoxy molding compound. A top surface 306 of the overmold 304 extends above the interconnect dice 106, effectively encapsulating the interconnect dice 106. The top surface 306 of the overmold 304 covers the conductive pillars 116. The overmold 304 provides a mechanical interconnection that secures the dice 102, 106 together for further processing.

Figure 3G:
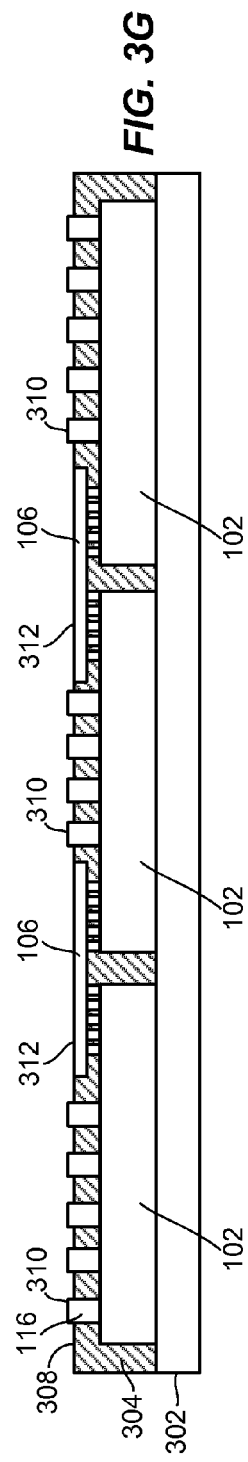
Figure 3H:
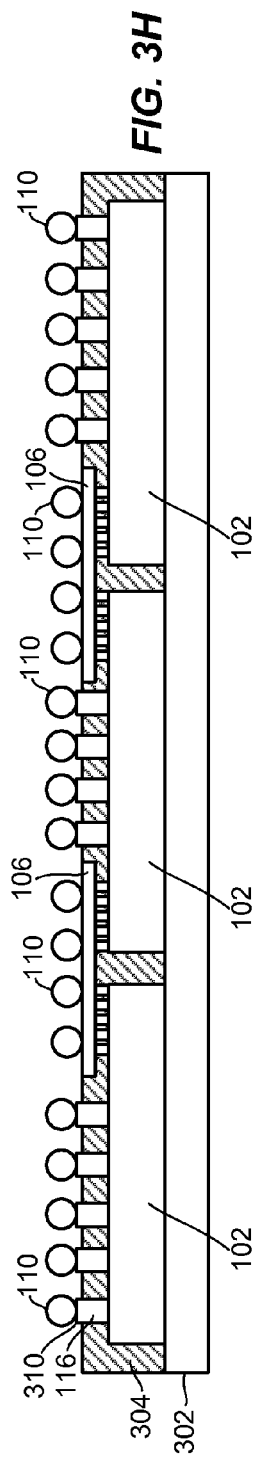

The top surface 306 of the overmold 304 is removed during a material removal process, such as backgrinding, chemical mechanical polishing, etching, milling or other suitable removal process, that thins the interconnect dice 106, as shown in FIG. 3G. After backgrinding, the new top surface 308 of the overmold 304 is substantially coplanar with a ground surface 312 (208 in FIG. 2) of the interconnect dice 106. The backgrinding process also exposes the pads 206 (shown in FIG. 2) formed on the interconnect die 106. Additionally, distal ends 310 of the conductive pillars 116, now exposed through the overmold 304, are also substantially coplanar with the top surface 308 of the overmold and ground surface 312 of the interconnect dice 106 having the exposed pads 206. This planar surface allows the use of electrical interconnections 110 having uniform size on both the pads 206 of interconnect die 106 and the conductive pillar 116, as shown in FIG. 3H.

Figure 3I:
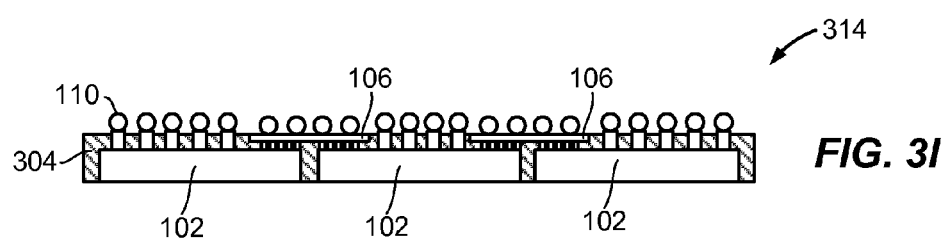
Figure 3J:
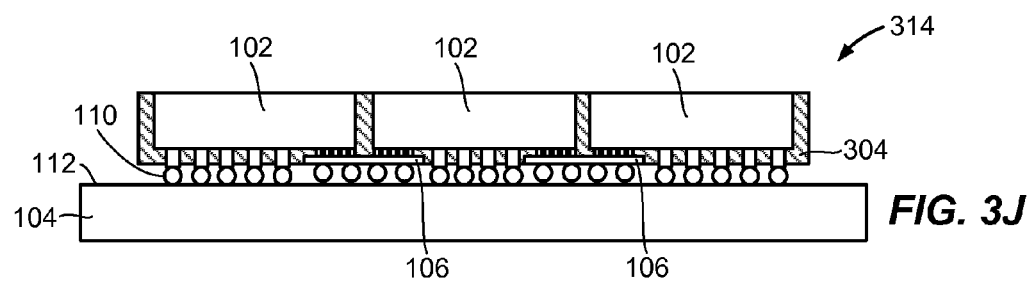

As shown in FIG. 3I, the carrier wafer 302 is removed to leave a semiconductor assembly 314 essentially comprising the dice 102 coupled directly, both electrically and mechanically, with the interconnect dice 106 using the electrical interconnections 110. Advantageously, the semiconductor assembly 314 may be tested to confirm the functionality of the dice 102 and interconnect dice 106 at this stage of manufacture without investing additional time and materials to generate a complete package substrate. For example, test equipment may utilize probes to contact the interconnections 110 formed on the pads 206 of interconnect die 106 and the conductive pillars 116 of the IC dice 102 comprising the semiconductor assembly 314, thus allowing the test equipment to interview with both the IC dice 102 and interconnect die 106 so that a testing routine may be performed to confirm the functionality of the dice 102, 106. The semiconductor assembly 314 may be cleaned and poly-bagged for shipment to another fabricator, or the semiconductor assembly 314 may be coupled directly, both electrically and mechanically, with the package substrate 104, as illustrated in FIG. 3J. Once the semiconductor assembly 314 is mounted to the package substrate 104, the undermold 124 is applied to form the finished IC package 100, as shown and described with reference to FIG. 1.

As discussed above, a single interconnect die 106 may be utilized to connect two or more dice 102. Additionally, two or more interconnect dice 106 may be utilized to directly connect two dice 102. In other implementations, two or more interconnect dice 106 may be utilized to connect two or more dice 102. Three non-limiting examples are provided in FIGS. 4-6 which depict simplified schematic top views of different implementations of an IC package having at least one interconnect die coupling at least two dice.

Figure 4:
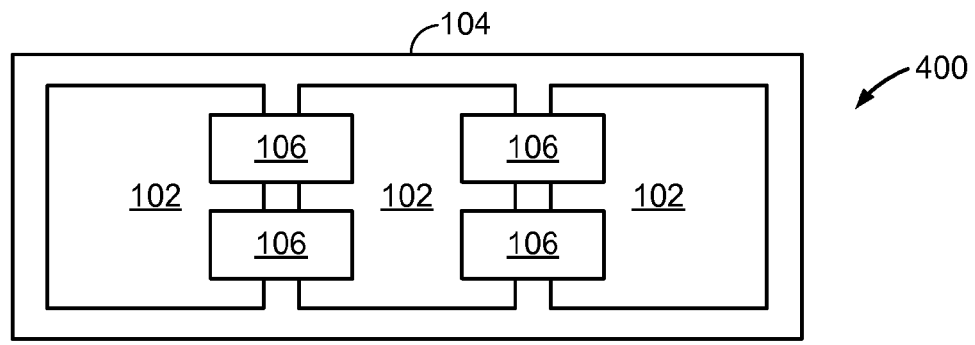
FIGS. 4-6 are simplified schematic top views of different implementations of an IC package having at least one interconnect die coupling at least two dice.

Referring first to FIG. 4, an IC package 400 is illustrated having at least one interconnect die 106 coupling at least two dice 102 mounted to a package substrate 104 similar to the manner shown in FIGS. 1 and 2. The interconnect die 106 may be configured as described herein, or in another manner suitable to provide communication between the two dice 102. In the implementation depicted in FIG. 4, three dice 102 are mounted to the package substrate 104, and each adjacent pair of dice 102 has two interconnect dice 106 providing communication between the paired dice 102. As discussed with reference to FIG. 2, one or more of the interconnect dice 106 may optionally provide a signal path for direct communication between at least one of the dice 102 and the package substrate 104.

Figure 5:
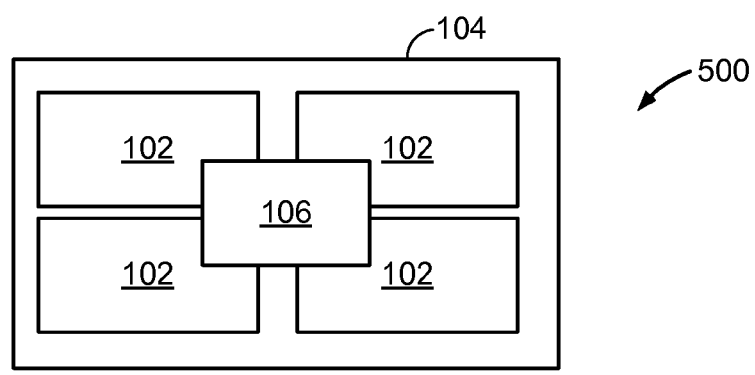

In the implementation depicted in FIG. 5, an IC package 500 is illustrated having a single interconnect die 106 coupling a plurality of dice 102 mounted to a package substrate 104 similar to the manner shown in FIGS. 1 and 2. The interconnect die 106 may be configured as described herein, or in another manner suitable to provide communication between the two dice 102. In the implementation depicted in FIG. 5, four dice 102 are mounted to the package substrate 104, while each die 102 is coupled to the interconnect die 106 for providing communication between each of the dice 102. As discussed with reference to FIG. 2, the interconnect dice 106 may optionally provide direct communication between at least one of the dice 102 and the package substrate 104.

Figure 6:
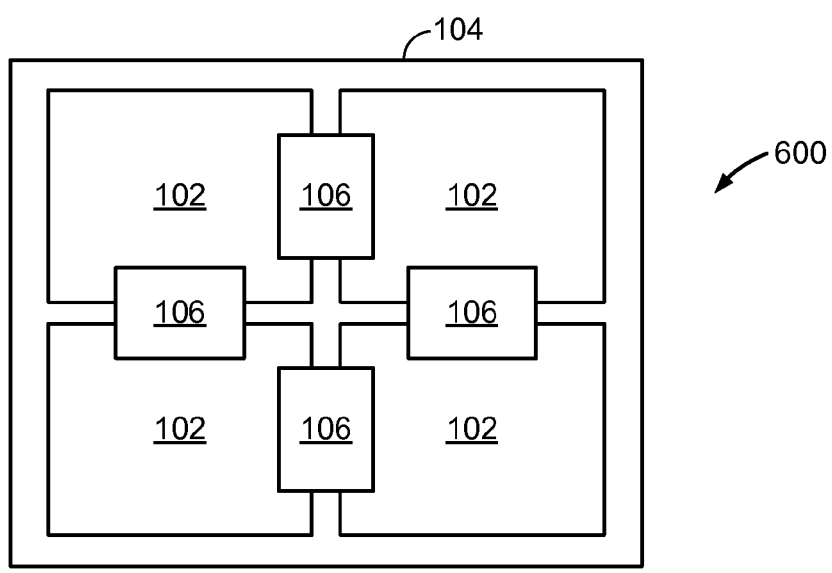

In the implementation depicted in FIG. 6, an IC package 600 is illustrated having at least two interconnect dice 106 coupling at least three dice 102 mounted to a package substrate 104 similar to the manner shown in FIGS. 1 and 2. The interconnect die 106 may be configured as described herein, or in another manner suitable to provide communication between the two dice 102. In the implementation depicted in FIG. 6, four dice 102 are mounted to the package substrate 104, while each die 102 is coupled to its laterally adjacent die 102 by at least one interconnect die 106 for providing communication between the dice 102. As discussed with reference to FIG. 2, the interconnect dice 106 may optionally provide direct communication between at least one of the dice 102 and the package substrate 104.

FIG. 4-6 are but a few possible implementations of IC packages which may utilize interconnect dice 106 to provide communication at least between two dice 102 of the IC package. Other configurations are contemplated. Some advantages provided by the use of one or more interconnect dice 106 as compared to conventional IC packages that utilize interposers include allowing more IC dice per unit area, elimination of the expensive interposers, improved performance and lower power consumption due to shorter wiring routes and reduced capacitance, greater supply chain flexibility as many FABs have the technology to produce smaller interconnect dice whereas very few FABs are capable of producing large interposers, and better defect and fault tolerance as interconnect die can be tested prior to mounting to the dice 102 and even once mounted to the die 102, a specific wiring path may be changed to bypass circuit defects within the interconnect die.

As discussed above, certain implications of the interconnect circuit 214 within the interconnect die 106 may include solid state circuitry, such as one or more of a memory device and a logic device. Alternatively or in addition to solid state circuitry, the interconnect die 106 may include one or more of an optical signal transmission device and MEMS device. Such solid state circuitry greatly enhances the functionality of the IC package 100. Some examples of solid state circuitry include programmable elements that enable bi-directional communication over a single conductor within the interconnect die 106, data pipelining through the interconnect die 106, programmable elements that enable data synchronizing clock delays through the interconnect die 106, and programmable elements that enable programmable input pad to output pad selection within the interconnect die 106, among others.

Figure 7:
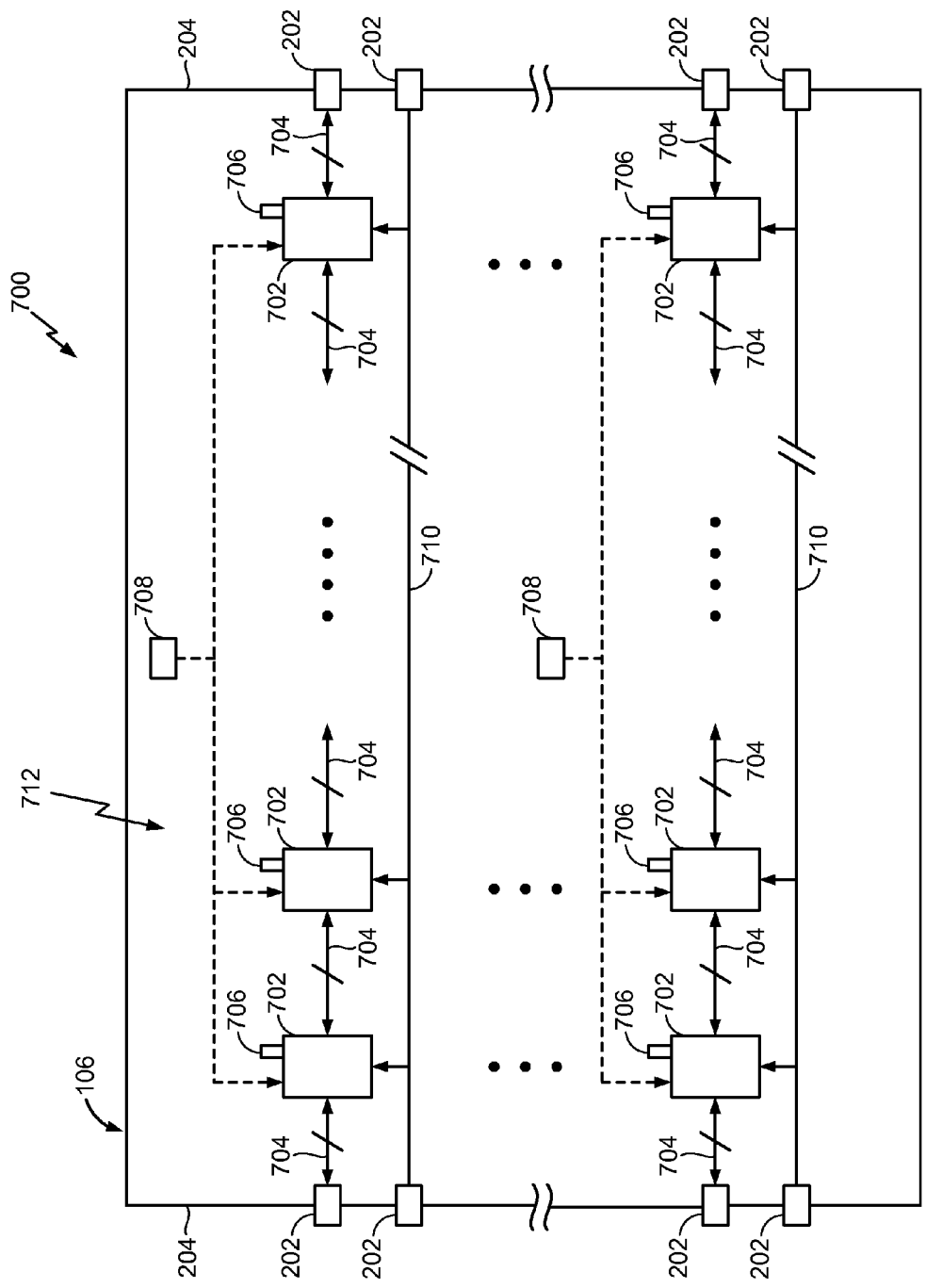
FIG. 7 is a schematic diagram of one implementation of an interconnect die having programmable elements.

For example, FIG. 7 is a schematic diagram of one implementation 700 of an interconnect die 106 having a plurality of programmable elements 702 forming a network 712. Each programmable element 702 of the network 712 includes logic circuitry formed within the interconnect die 106. Control signals for the programmable elements 702 may be provided by control logic 708 disposed on the interconnect die 106. In other implementations, the control logic may be provided from an external source to the interconnect die 106. Advantages of the use of the network 712 of programmable elements 702 include the reduction of the wire load of output drivers, and higher data rates at lower power.

The interconnect die 106 illustrated in FIG. 7 includes pads 202 formed on a first surface 204 of the interconnect 106. In the schematic diagram of FIG. 7, the pads 202 on one side of the network 712 of programmable elements 702 may be coupled to one IC die 102 while the pads 202 on the opposite side of the network 712 of programmable elements 702 may be coupled to a different IC die 102. Alternatively, some of the pads 202 illustrated in FIG. 7 may be pads 206 for coupling to the package substrate 104. Routing 710 generally runs between a set of pads 202 to provide a clock signal through the interconnect die 106. Between another set of pads 202, one or more programmable elements 702 are arranged to provide a bi-directional data path to increase the capacity of data which may be transmitted through the interconnect die 106, thereby increasing the speed and bandwidth of the IC package 100. The bi-directional data path also allows a single track per channel, which reduces the number of conductors needed with a corresponding reduction in capacitance and manufacturing complexity.

In the implementation depicted in FIG. 7, a plurality of serial strings of programmable elements 702 are routed between predefined pairs of pads 202. Each programmable element 702 in a serial string of programmable elements 702 is coupled by a bi-directional conductor 704, with the programmable elements 702 at the end of each serial string of programmable elements 702 also being coupled to the respective pads 202 by a bi-directional conductor 704. The programmable elements 702 include a bypass function, which is controlled by bypass logic 706. Bypass control signals for the programmable elements 702 may be provided by bypass logic 706 disposed on the interconnect die 106. In other implementations, the bypass logic may be provided from an external source to the interconnect die 106.

Figure 8:
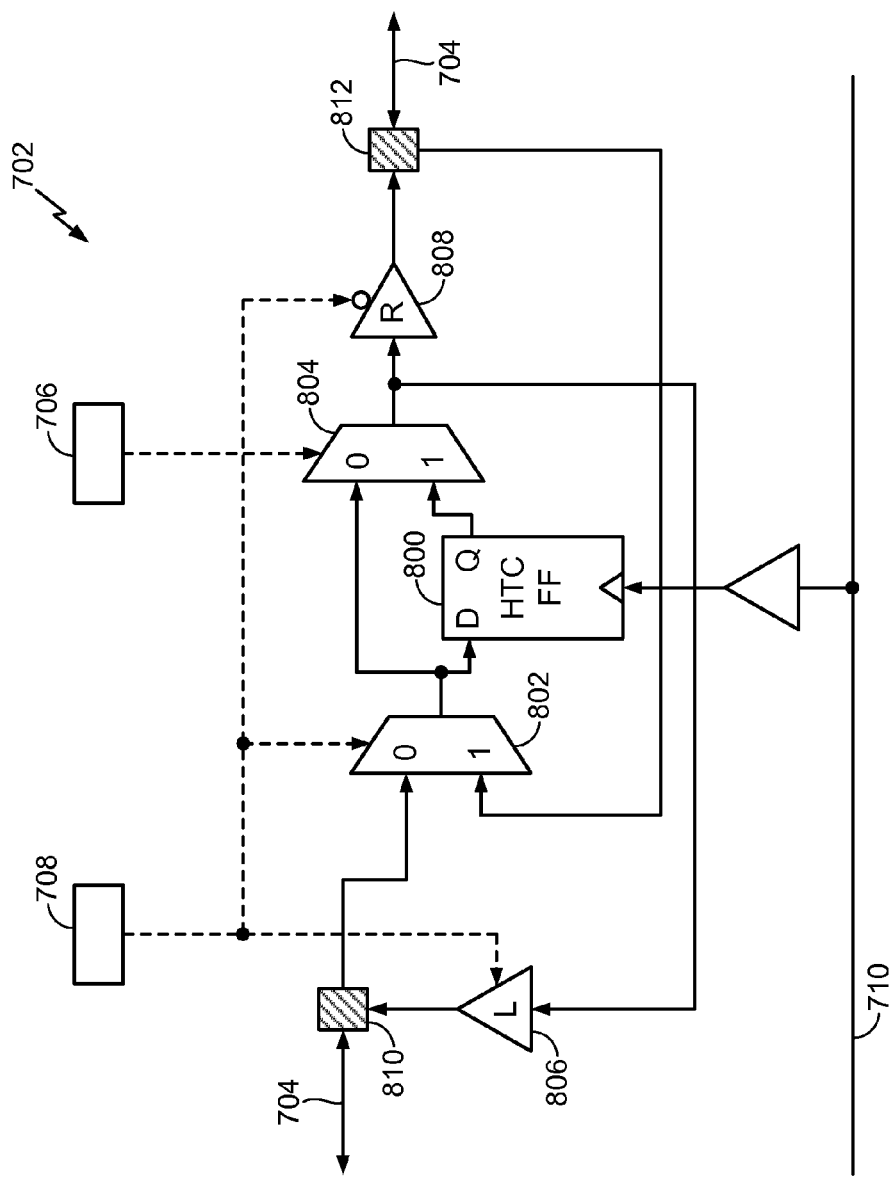
FIG. 8 is a schematic diagram of one embodiment of a functional implementation of the programmable element depicted in the implementation of FIG. 7.

FIG. 8 is a schematic diagram of one embodiment of a functional implementation of the programmable element 702 depicted in the implementation 700 illustrated in FIG. 7, which enables bi-directional transmission of signals between two pads 202, 206 formed on the interconnect die 106. The programmable element 702 includes a first node 810 and a second node 812. The first node 810 and the second node 812 each couple with a bidirectional conductor 704 external to the element 702. The conductors 704 can be used to connect to pads 202, 206, or other elements 702.

The first node 810 is coupled to one input of a first mux 802. The first node 810 is also coupled to an output of a first 3-state buffer 806. The second node 812 is coupled to an input of the first 3-state buffer 806. Control logic 708 discussed above controls that state of the first 3-state buffer 806.

The second node 812 is coupled to the other input of the first mux 802. The state of the first mux 802 is controlled by the control logic 708. The output of the first mux 802 is coupled to both a second mux 804 and a flip-flop 800. The flip-flop 800 is controlled by the clock signal provided on conductor 710. The output of flip-flop 800 is coupled to the second mux 804.

The output of the second mux 804 is coupled both to the input of the 3-state buffer 806 and an input of a 3-state buffer 808. Control logic 708 discussed above controls the state of the 3-state buffer 808 in a way that the 3-state buffers 806, 808 together can be considered a multiplexor with the output of control logic 708 as the select input of the multiplexor. The output of the 3-state buffer 808 is coupled to the second node 812.

In operation, the control logic 708 and bypass logic 706 select the states of the 3-state buffers and muxes. The state of the control logic 708 sets the direction of signal transmission through the interconnect circuitry 214 comprised by the programmable elements 702. The state of the by-pass logic determines whether or not the flip-flop 800 is bypassed in the transmission of signals from node 810 to node 812 or vice versa.

Figure 9:
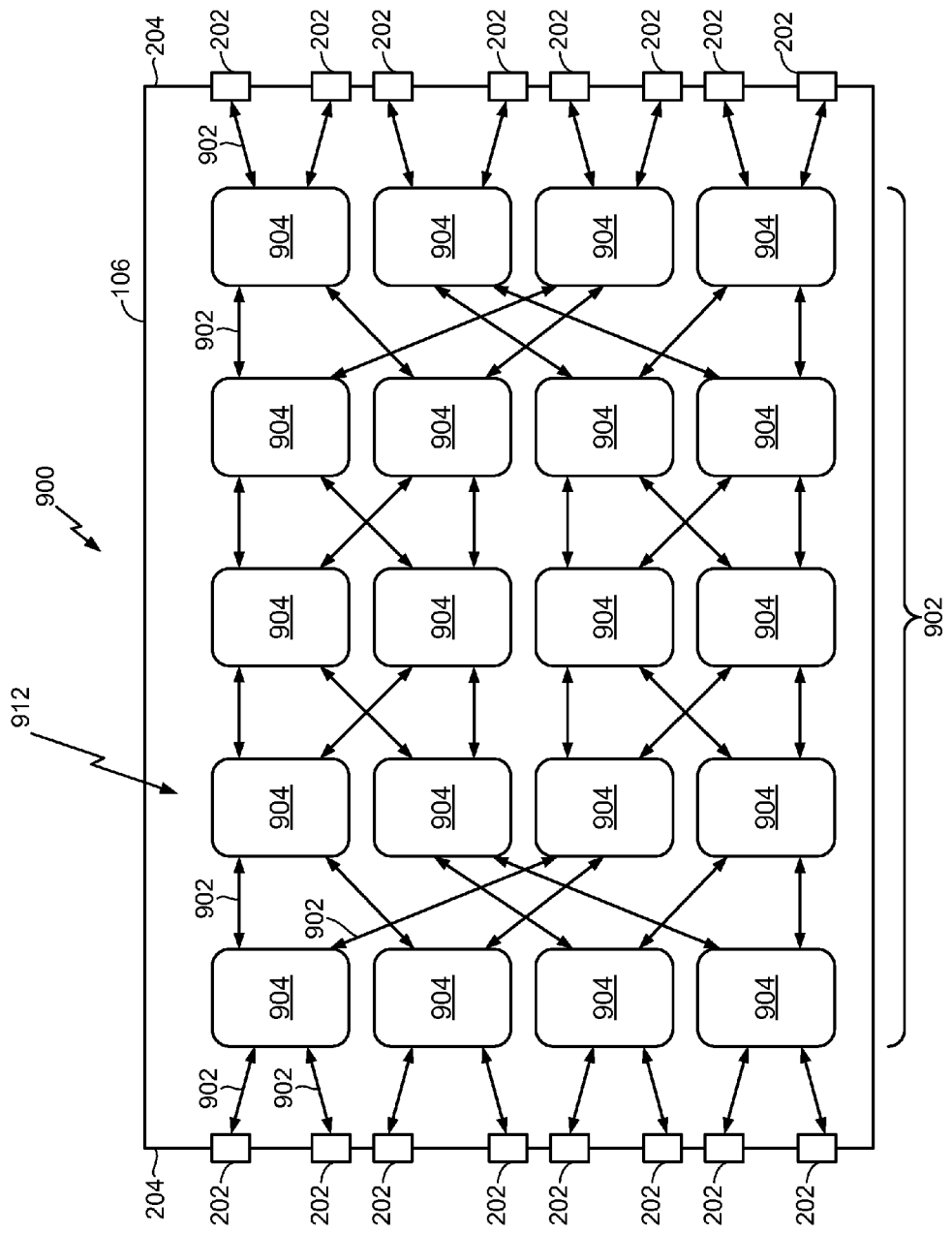
FIG. 9 is a schematic diagram of another implementation of an interconnect die having programmable elements.

FIG. 9 is a schematic diagram of another implementation 900 of an interconnect die 106 having an interconnect circuit 214 comprised of a plurality of programmable elements 904, forming a programmable point-to-point network 912 on the interconnect die 106. Each programmable element 904 includes logic circuitry formed within the interconnect die 106. Control signals for the programmable elements 904 may be provided by control logic (such as shown in FIG. 7) disposed on the interconnect die 106. In other implementations, the control logic may be provided from an external source to the interconnect die 106.

The interconnect die 106 illustrated in FIG. 9 includes pads 202 formed on a first surface 204 of the interconnect 106. In the schematic diagram of FIG. 9, the pads 202 on one side of the network 912 of programmable elements 904 may be coupled to one IC die 102, while the pads 202 on the opposite side of the network 912 of the programmable elements 904 may be coupled to a different IC die 102. Alternatively, some of the pads 202 illustrated in FIG. 9 may be pads 206 for coupling to the package substrate 104. The plurality of programmable elements 904 are arranged between the plurality of pads 202 using bi-directional conductive path 902. The control logic allows the state of each programmable element 904 to be set in a manner that controls the direction of data flow through the programmable element 904, and to which programmable elements 904 the data will be routed. Thus, the control logic allows the state of each programmable element 904 to be set so each pad 202 may be selectively connected to a selected another one of the pads 202 for communication in a predetermined direction. The programmable pad 202 to pad 202 configuration of the interconnect circuit 214 enables a truly programmable selection of the interconnect routing between dice 102 connected by the interconnect die 106, which greatly increases the functional capability and design flexibility of the IC package 100.

In the implementation depicted in FIG. 9, the interconnect circuit 214 of the interconnect die 106 includes a network 912 of programmable elements 904 connected between the pads 202 by the bi-directional conductive path 902. The programmable elements 904 at the outside of the network 912 of programmable elements 904 also being coupled to the pads 202 by a bi-directional conductive path 902. Each programmable element 904 is controlled by control logic as discussed above. Each programmable element 904 may change state to set the direction of data through the programmable element 904, for example, from left to right or from right to left, and to set to which adjacent programmable element 904 will receive the signal exiting the programmable element 904.

Figure 10:
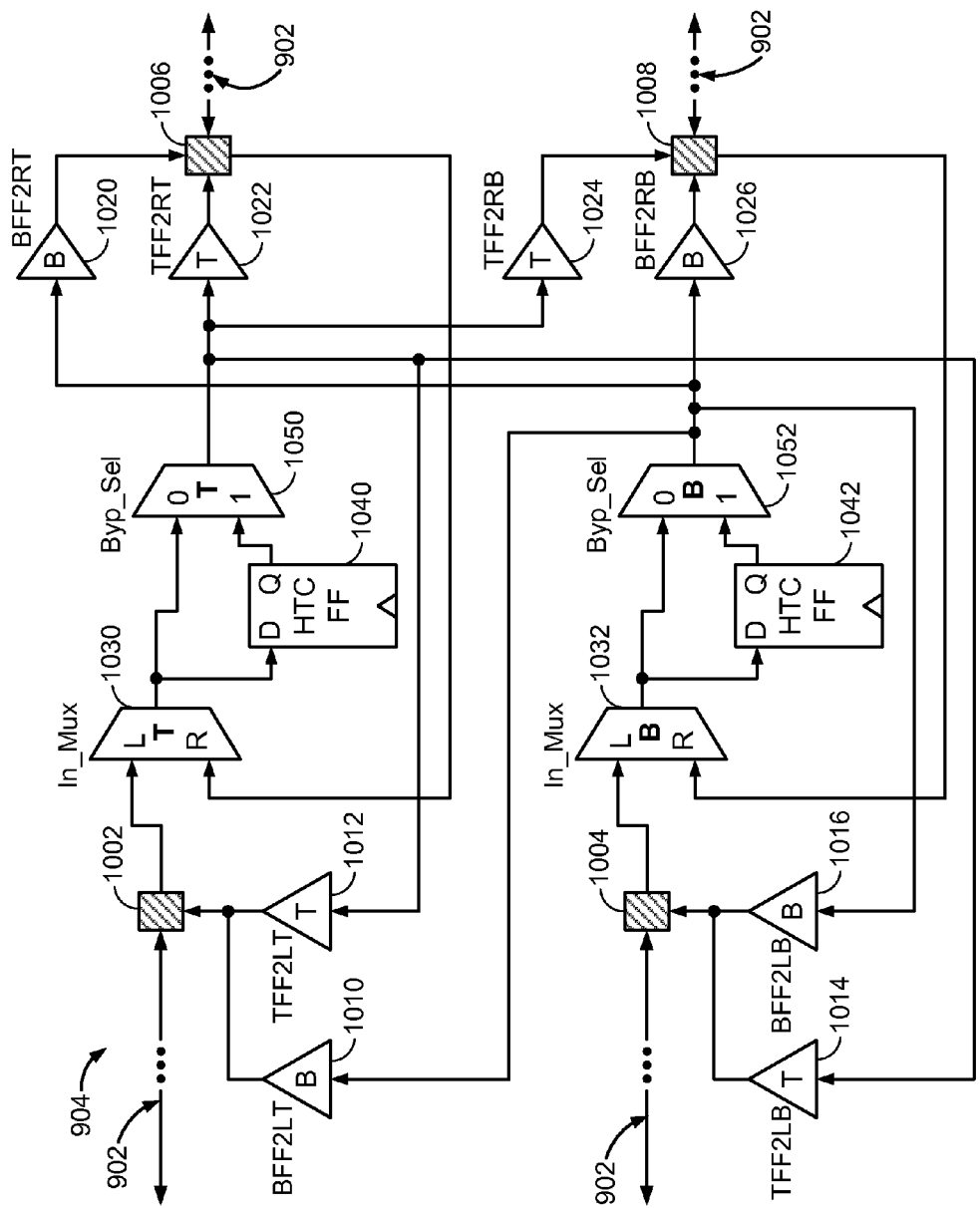
FIG. 10 is a schematic diagram of one embodiment of a functional implementation of the programmable element depicted in the implementation of FIG. 9.

FIG. 10 is a schematic diagram of one embodiment of a functional implementation of the network 912 of programmable elements 904 depicted in the implementation 900 illustrated in FIG. 9, which enables bi-directional transmission of signals between two pads 202 formed on the interconnect die 106. The programmable element 904 includes a first node 1002, a second node 1004, a third node 1006, and a fourth node 1008, each connected to other components through bidirectional conducting paths 902 as shown in FIG. 10. The conductors 902 can be used to connect to pads 202, 206, or other elements 904.

Outputs of a first 3-state buffer 1010 and a second 3-state buffer 1012 are coupled to the first node 1002. An input to a first mux 1030 is coupled to the first node 1002. The first node 1002 may be connected by a bi-directional conductive path 902 to one of the programmable elements 904 in the next column of programmable elements 904, or to the pads 202, 206 formed on one side of the interconnect network 912.

Outputs of a third 3-state buffer 1014 and a fourth 3-state buffer 1016 are coupled to the second node 1004. An input to a second mux 1032 is coupled to the second node 1004. The second node 1004 may be connected by a bi-directional conductive path 902 to one of the programmable elements 904 in the next column of programmable elements 904, or to the pads 202, 206 formed on one side of the interconnect network 912.

Outputs of a fifth 3-state buffer 1020 and a sixth 3-state buffer 1022 are coupled to the third node 1006. An input to the first mux 1030 is coupled to the third node 1006. The third node 1006 may be connected by a bi-directional conductive path 902 to one of the programmable elements 904 in the next column of programmable elements 904, or to the pads 202, 206 formed on one side of the interconnect network 912.

Outputs of a seventh 3-state buffer 1024 and an eighth 3-state buffer 1026 are coupled to the fourth node 1008. An input to a second mux 1032 is coupled to the fourth node 1008. The fourth node 1008 may be connected by a bi-directional conductive path 902 to one of the programmable elements 904 in the next column of programmable elements 904, or to the pads 202, 206 formed on one side of the interconnect network 912.

Output from the first mux 1030 is coupled to an input of a first flip-flop 1040 and an input of a third mux 1050. Output from the first flip-flop 1040 is coupled to the input of the third mux 1050.

Output from the second mux 1032 is coupled to an input of a second flip-flop 1042 and an input of a fourth mux 1052. Output from the second flip-flop 1042 is coupled to the input of the fourth mux 1052.

Output from the third mux 1050 is coupled to the input of the second 3-state buffer 1012, the third 3-state buffer 1014, the sixth 3-state buffer 1022 and the seventh 3-state buffer 1024.

Output from the fourth mux 1052 is coupled to the input of the first 3-state buffer 1010, the fourth 3-state buffer 1016, the fifth 3-state buffer 1020 and the eighth 3-state buffer 1026.

Control signals for the various muxes, flip-flop and buffers of programmable element 904 may be provided by control logic (for example, as shown in FIG. 7) disposed on the interconnect die 106. In other implementations, the control logic may be provided from an external source to the interconnect die 106.

FIG. 11 is a logic table 1100 for the functional implementation of the programmable element 904 illustrated in FIG. 10. The columns under the heading "Configuration" of the table 1100 provide the direction, path and bypass status of the programmable element 904. The path may be provided in two additional modes: (1) broadcast from bottom and (2) broadcast from top. The "Control Signals" to each of the muxes and buffers are listed to the right of the "Configuration". Although the connections are provided in terms of which nodes of a single programmable element 904 are connected, when distributed across all of the programmable elements 904 depicted in FIG. 9, the connections are ultimately made between the pads 202, 206 on one side of the network 912 with pads 202, 206 on the opposite side of the network 912 in a manner that is a one-to-one mapping, or a permutation, between pads 202, 206 on one side of the network 912 with pads 202, 206 on the opposite side of the network 912. The programmable elements 904 of the network 912 can be programmed using control logic to realize all possible permutations between pads 202, 206 on one side of the network 912 with pads 202, 206 on the opposite of the network 912. In the first row of the table 1100, the control signals are set in a manner that connects the node 1002 and node 1006 through the un-bypassed flip-flop 1040 and node 1004 to node 1008 through the un-bypassed flip-flop 1042 in a left to right signal direction. In the second row of the table 1100, the control signals are set in the same manner as the first row of the table 1100 with the exception that the flip-flops 1040, 1042 are bypassed. In the third row of the table 1100, the control signals are set in a manner that connects the node 1002 and node 1008 through the un-bypassed flip-flop 1040 and node 1004 to node 1006 through the un-bypassed flip-flop 1042 in a left to right signal direction. In the fourth row of the table 1100, the control signals are set in the same manner as the third row of the table 1100 with the exception that the flip-flops 1040, 1042 are bypassed. In the fifth row of the table 1100, the control signals are set in a manner that connects the node 1006 and node 1002 through the un-bypassed flip-flop 1040 and node 1008 to node 1004 through the un-bypassed flip-flop 1042 in a right to left signal direction. In the sixth row of the table 1100, the control signals are set in the same manner as the fifth row of the table 1100 with the exception that the flip-flops 1040, 1042 are bypassed. In the seventh row of the table 1100, the control signals are set in a manner that connects the node 1006 and node 1004 through the un-bypassed flip-flop 1040 and node 1008 to node 1002 through the un-bypassed flip-flop 1042 in a right to left signal direction. In the eighth row of the table 1100, the control signals are set in the same manner as the seventh row of the table 1100 with the exception that the flip-flops 1040, 1042 are bypassed. Thus, when disposed in an array within the interconnect circuit 214 of the interconnect die 106, the programmable elements 904 enable fully addressable and bi-directional signal transmission between all the pads 202 coupled to different IC dice 102, and in some embodiments, between one or more IC dice 102 and the pads 206 coupled to the package substrate 104.

Figure 12:
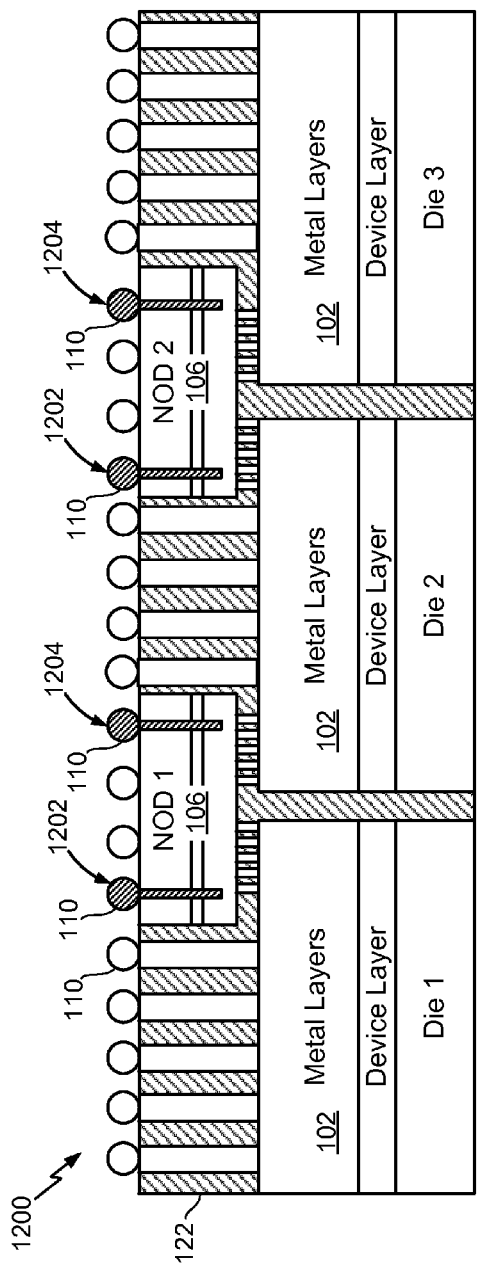
FIG. 12 is a schematic cross-sectional view of an example of a semiconductor assembly having an interconnect die that is powered directly through a package substrate.

FIG. 12 is a schematic cross-sectional view of an example of a semiconductor assembly 1200 having an interconnect die 106 that is powered directly through the interconnect die 106. The semiconductor assembly 1200 is generally constructed similarly as described with reference to FIGS. 1 and 2. The interconnect die 106 includes an interconnect circuit 214 that includes active solid state elements, and thus, there is a need to provide power to the interconnect circuit 214 of the interconnect die 106. In the embodiment depicted in FIG. 12, power is provided to the interconnect die 106 through one of the electrical interconnections 110 coupling the interconnect die 106 to the package substrate 104 (shown in FIGS. 1 and 2). For example, a power supply path 1202 to the interconnect circuit 214 may be provided through one of the electrical interconnections 110 coupling the interconnect die 106 to the package substrate 104, while a power return path 1204 may be provided through another one of the electrical interconnections 110 coupling the interconnect die 106 to the package substrate 104. One advantage of the configuration of FIG. 12 is that the power supply and return paths 1202, 1204, which may be the form of vias extending through the interconnect die 106, being isolated from the dice 102, have minimal contribution to stresses induced to the IC package 100 during fabrication and operation. Another advantage of the configuration depicted in FIG. 12 is that the power-supply dice 102 can be designed to be independent of the power-supply design of the interconnect dice 106. Moreover, multiple power supply and return paths 1202, 1204 may be distributed across the interconnect die 106 in a manner that separates power transmission from the programmable elements of the interconnect circuit 214 from portion of the interconnect circuit 214 configured for data transmission, which serves to diminish unwanted heating of the programmable elements 702 and 904 and unwanted mechanical stresses affecting the devices comprising the programmable elements 702 and 904 that could potentially diminish performance of the interconnect circuit 214 of the interconnect die 106, and to diminish potential corruption of data.

Alternatively, the power supply and return paths may be provided through the dice 102 to the interconnect die 106. For example as depicted in a schematic cross-sectional view of another example of a semiconductor assembly 1300 in FIG. 13, a power supply path 1302 is routed through the die 102 from the package substrate 104 (shown in FIGS. 1 and 2) to the interconnect circuitry 214 of the interconnect die 106. Similarly, a power return path 1304 is routed from the interconnect circuitry 214 of the interconnect die 106 through the die 102 to the package substrate 104. The configuration of FIG. 13 may be advantageous when the power supply and return paths 1302, 1304 may provide shared power to both dice 102, 106. Additionally, the interconnect die 106 does not require vias for the power supply and return paths 1302, 1304.

Figure 14:
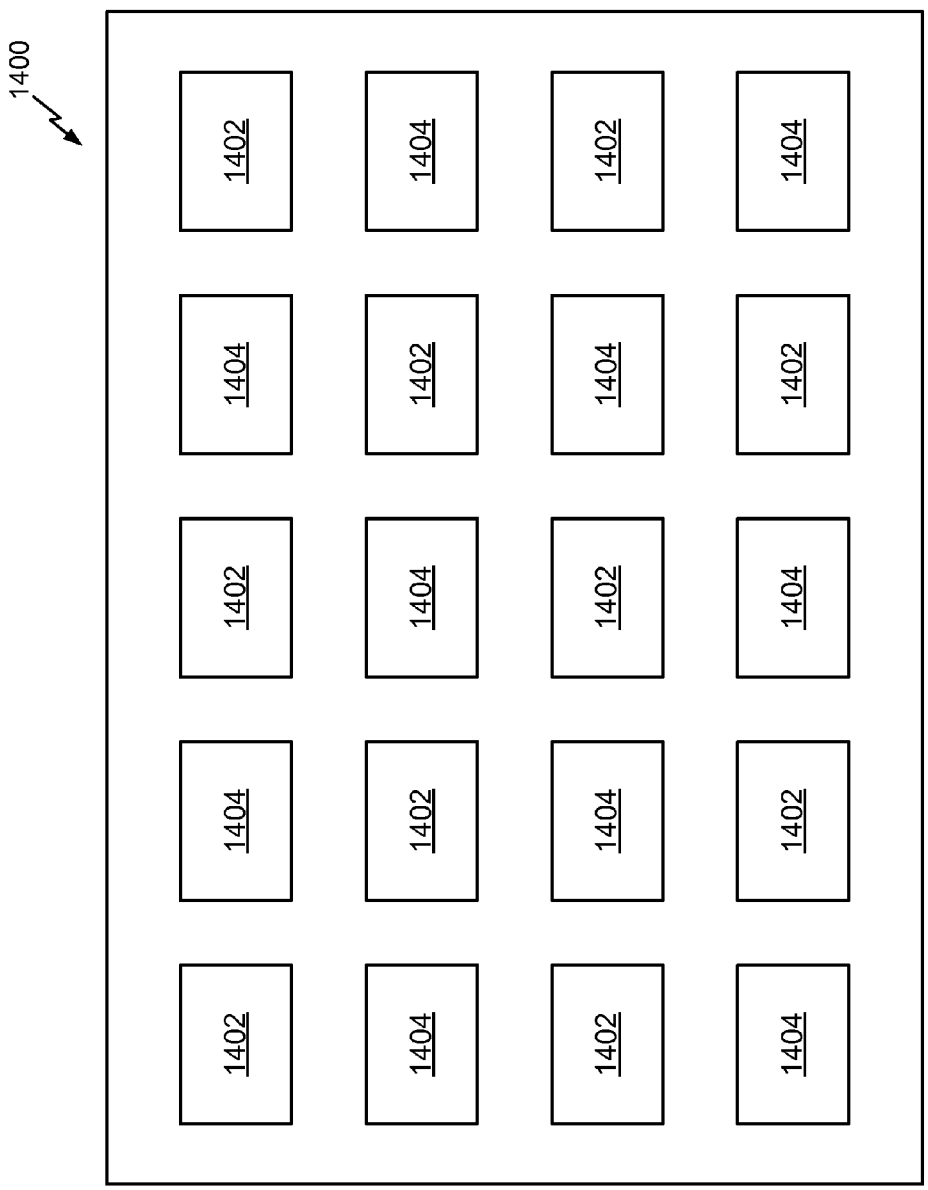
FIG. 14 is a schematic diagram of a power delivery scheme in a chip package having an interconnect die.

FIG. 14 is a schematic diagram of a power delivery scheme 1400 in a chip package having an interconnect die. The power delivery scheme 1400 may be utilized with the chip package and interconnect die described above, or other suitable chip package.

Figure 13:
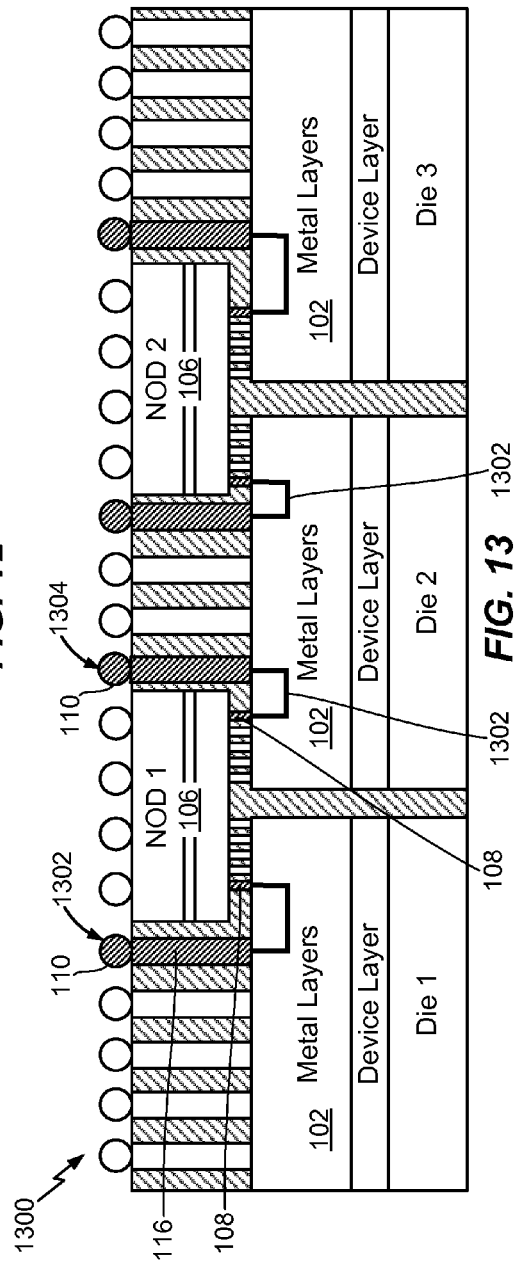
FIG. 13 is a schematic cross-sectional view of another example of a semiconductor assembly having an interconnect die that is powered directly through a die.

The power delivery scheme 1400 includes grouping the power supply and return paths for powering the interconnect dice 106, such as the power supply and return paths 1202, 1204 shown in FIG. 12 and the power supply and return paths 1302, 1304 shown in FIG. 13, in discrete groupings that are separated from non-power signal paths for communicating with either the dice 102 or dice 106. For example, the power supply and return paths for powering the interconnect dice 106 may be grouped into discrete regions 1402 which are separate and distinct from regions 1404 utilized for data transmission paths for communicating with either the dice 102 or dice 106. In some embodiments, the regions 1402 utilized for transmitting power may include vias while regions 1404 utilized for data transmission may contain no vias.

The discrete regions 1402 for the power supply and return paths provide a measure of isolation from the data transmission regions 1404 being isolated from the dice 102, and thus have minimal contribution to stresses induced to the IC package 100 during fabrication and operation. Another advantage of the configuration depicted in FIG. 14 is that multiple regions 1402 of power supply and return paths may be distributed across the interconnect die 106 in a manner that separates power transmission from the programmable elements of the interconnect circuit 214 from portion of the interconnect circuit 214 configured for data transmission, which serves to diminish unwanted heating of the programmable elements and unwanted mechanical stress on devices and components comprising programmable elements that could potentially diminish performance of the interconnect circuit 214 of the interconnect die 106, and to diminish potential corruption of data.

In the implementations described above, the use of an interconnect die has been shown to improve semiconductor assemblies and IC packages. The interconnect die enables die-to-die interconnection that reduces power consumption and RC loads, while allowing faster operation with smaller footprints. In some implementations, the interconnect die includes solid state interconnect circuitry that enables increased functionally of the IC package. For example, solid state interconnect circuitry of the interconnect die may allow enhanced programming flexibility, ability to pipeline signals through the interconnect die, to multiplex connections through the interconnect die, and improve defect and fault tolerance by allowing signals to be rerouted within the interconnect die to avoid current defects or defect manifesting later in use.

Certain embodiments of the present technology may be expressed as methods. In a first example, a method of manufacturing a semiconductor assembly is provided that includes securing at least two integrated circuit (IC) dice to a carrier substrate, the IC dice having a plurality of conductive pillars extending therefrom; connecting an interconnect die to the IC dice, the connection between the interconnect die and the IC dice suitable for transmitting signals therebetween; covering the interconnect die and the IC dice with an overmold; removing a portion of the interconnect die and the overmold to expose the conductive pillars; forming electrical interconnects on the conductive pillars and interconnect die; and removing the carrier substrate.

In a second example, the method of the first example may further comprise connecting the interconnect die and the IC dice to a package substrate utilizing the electrical interconnects.

In a third example, a method for routing signals in an IC package is provided that further includes transmitting signals from a first integrated circuit (IC) die to a second IC die through a first interconnect die directly coupled to the IC dice by inter-die connections; and transmitting signals between the first interconnect die directly coupled to a package substrate by the IC dice by electrical interconnects.

In a fourth example, the method of the third example, wherein transmitting signals from the first IC die to the second IC die, may further include routing the transmitted signals through a solid state circuitry formed in the first interconnect die.

In a fifth example, the method of the third example, wherein routing the transmitted signals through a solid state circuitry, may further include at least one of: pipelining the transmitted signals through the first interconnect die, delaying a clock signal passing through the first interconnect die and passing the transmitted signals through a programmable network form in the first interconnect die.

In a sixth example, the method of the third example may further include transmitting signals from the first integrated circuit (IC) die to the second IC die through a second interconnect die directly coupled to the IC dice by inter-die connections.

In a seventh example, the method of the third example may further include transmitting signals from the first integrated circuit (IC) die to a third IC die through a second interconnect die directly coupled to the first and third IC dice by inter-die connections.

In an eighth example, a method for testing an interconnect die coupled with two or more IC dice is provided that includes electrically contacting probes to circuitry formed in the IC dice and interconnect die prior to coupling the interconnect die and IC die to a packaging substrate, and testing the functionality of the interconnect die.

In a ninth example, the method of the eighth example may further include when testing the functionality of the interconnect die, confirming that each one of a first plurality of conductive pads connecting a first IC die of the two or more IC dice to the interconnect die may be selectively connected with a selected one of a second plurality of conductive pads connecting a second IC die of the two or more IC dice to the interconnect die.

In a tenth example, the method of the eighth example may further include when testing the functionality of the interconnect die, confirming that signals may be pipelined between the IC dice through the interconnect die.

To facilitate understanding, identical reference numerals have been used, where possible, to designate identical elements that are common to the figures. It is contemplated that elements of one example may be beneficially incorporated in other examples.

While the foregoing is directed to specific examples, other and further examples may be devised without departing from the basic scope thereof, and the scope thereof is determined by the claims that follow.

What is claimed is:

1. A semiconductor assembly, comprising:
   a first integrated circuit (IC) die;
   a second IC die; and
   a first interconnect die coupled to the IC dice by inter-die connections, the first interconnect die having solid state circuitry providing a programmable bi-directional signal transmission path between the IC dice through the first interconnect die, wherein the solid state circuitry is operable to select a routing of the bi-directional signal transmission path between any one of a first plurality of conductive pads formed on the first interconnect die for connection with any one of a second plurality of conductive pads formed on the first interconnect die.

2. The semiconductor assembly of claim 1 further comprising:

a plurality of conductive pillars extending from the first IC die; and a surface substantially coplanar with distal ends of the conductive pillars.

3. The semiconductor assembly of claim 1, wherein the conductive pillars extend about 60 to 80 μm from the first IC die.

4. The semiconductor assembly of claim 1 further comprising:

a second interconnect die coupled to at least one of the IC dice by inter-die connections.

5. The semiconductor assembly of claim 1, wherein the first interconnect die further comprises:

memory coupled to the solid state circuitry.

6. The semiconductor assembly of claim 1 further comprising:

a package substrate coupled to the IC dice by a plurality of electrical interconnects, wherein the package substrate is coupled to the first interconnect die by a plurality of electrical interconnects.

7. The semiconductor assembly of claim 1, wherein the first interconnect die comprises a thickness of less than 250 microns.

8. The semiconductor assembly of claim 1, wherein the first interconnect die has a plan area less than that of at least one of the IC dices.

9. The semiconductor assembly of claim 1 further comprising:

at least a third IC die coupled to the first interconnect die by inter-die connections, the solid state circuitry configured to provide a programmable point to point signal transmission path between the first, second and at least third IC dice through the first interconnect die.

10. The semiconductor assembly of claim 1, wherein first interconnect die further comprises:

a thickness of less than 80 microns.

11. A semiconductor assembly, comprising:

a first integrated circuit (IC) die;

a second IC die; and a first interconnect die coupled to the IC dice by inter-die connections, the first interconnect die having solid state circuitry providing a programmable bi-directional signal transmission path between the IC dice through the first interconnect die, wherein the bi-directional signal transmission path of solid state circuitry includes a plurality of programmable elements serially coupled between a first inter-die connection of the inter-die connections coupling the solid state circuitry to the first die and a second inter-die connection of the inter-die connections coupling the solid state circuitry to the second die, the plurality of programmable elements operable to pipeline data through the first interconnect die between the first and second inter-die connections.

12. The semiconductor assembly of claim 11 further comprising:

a plurality of conductive pillars extending from the first IC die; and a surface substantially coplanar with distal ends of the conductive pillars.

13. The semiconductor assembly of claim 11, wherein the conductive pillars extend about 60 to 80 μm from the first IC die.

14. The semiconductor assembly of claim 11 further comprising:

a second interconnect die coupled to at least one of the IC dice by inter-die connections.

15. The semiconductor assembly of claim 11, wherein the first interconnect die further comprises:

memory coupled to the solid state circuitry.

16. The semiconductor assembly of claim 11 further comprising:

a package substrate coupled to the IC dice by a plurality of electrical interconnects, wherein the package substrate is coupled to the first interconnect die by a plurality of electrical interconnects.

17. The semiconductor assembly of claim 11, wherein the first interconnect die comprises a thickness of less than 250 microns.

18. The semiconductor assembly of claim 11, wherein the first interconnect die has a plan area less than that of at least one of the IC dices.

19. The semiconductor assembly of claim 11 further comprising:

at least a third IC die coupled to the first interconnect die by inter-die connections, the solid state circuitry configured to provide a programmable point to point signal transmission path between the first, second and at least third IC dice through the first interconnect die.

20. The semiconductor assembly of claim 11, wherein first interconnect die further comprises:

a thickness of less than 80 microns.

* * * * *